United States Patent
Tamai

(10) Patent No.: US 9,444,160 B2
(45) Date of Patent: Sep. 13, 2016

(54) ELECTRICAL CONNECTOR

(71) Applicant: Hirose Electric Co., Ltd., Tokyo (JP)

(72) Inventor: Nobuhiro Tamai, Tokyo (JP)

(73) Assignee: HIROSE ELECTRIC CO., LTD., Tokyo (JP)

(*) Notice: Subject to any disclaimer, the term of this patent is extended or adjusted under 35 U.S.C. 154(b) by 0 days.

(21) Appl. No.: 14/451,470

(22) Filed: Aug. 5, 2014

(65) Prior Publication Data
US 2015/0044888 A1    Feb. 12, 2015

(30) Foreign Application Priority Data

Aug. 6, 2013  (JP) ................................ 2013-163326

(51) Int. Cl.
*H01R 12/70*    (2011.01)
*H05K 1/02*    (2006.01)

(52) U.S. Cl.
CPC ........ *H01R 12/7082* (2013.01); *H05K 1/0245* (2013.01); *H05K 1/0219* (2013.01); *H05K 2201/09245* (2013.01); *H05K 2201/09336* (2013.01)

(58) Field of Classification Search
CPC .. H05K 1/117; H01R 23/7068; H01R 12/72; H01R 12/721; H01R 12/728
See application file for complete search history.

(56) References Cited

U.S. PATENT DOCUMENTS

| | | | | |
|---|---|---|---|---|
| 4,736,275 A * | 4/1988 | Kendall et al. | ............... | 361/767 |
| 5,319,523 A * | 6/1994 | Ganthier et al. | ............... | 361/753 |
| 5,713,126 A * | 2/1998 | Sakemi | ........................... | 29/843 |
| 6,425,766 B1 * | 7/2002 | Panella | ........................... | 439/59 |
| 7,291,037 B2 * | 11/2007 | Tsai | ............................... | 439/492 |
| 7,762,818 B2 * | 7/2010 | Hoang | ................... | H05K 1/117 439/62 |
| 8,866,291 B2 * | 10/2014 | Alm | ............................... | 257/728 |
| 8,913,390 B2 * | 12/2014 | Malek et al. | ................. | 361/714 |
| 8,946,562 B2 * | 2/2015 | Moul et al. | .................... | 174/260 |
| 2012/0295453 A1 | 11/2012 | Cipolla et al. | | |

FOREIGN PATENT DOCUMENTS

| | | |
|---|---|---|
| JP | 51-144761 U1 | 5/1975 |
| JP | 56-119284 U1 | 2/1980 |
| JP | 2004-363032 A | 12/2014 |

* cited by examiner

*Primary Examiner* — Gary Paumen
(74) *Attorney, Agent, or Firm* — Kubotera & Associates, LLC

(57) ABSTRACT

An electrical connector is to be connected to a mating connector. The electrical connector includes a circuit board member formed of an insulation plate member; and a holding member for holding the circuit board member. The circuit board member includes a connecting portion to be connected with a mating connector of the mating connector. The connecting portion includes a pair of conductive band portions and a first insulation region disposed between the conductive band portions.

6 Claims, 8 Drawing Sheets

ELECTRICAL CONNECTOR

BACKGROUND OF THE INVENTION AND RELATED ART STATEMENT

The present invention relates to an electrical connector, in which a flat circuit board such as a circuit board member having a board circuit configuration is held with a holding member. In particular, the present invention relates to an electrical connector, in which a flat circuit board such as a circuit board member having a board circuit configuration suitable for high-speed transmission is held with a holding member.

As a conventional board circuit configuration in a circuit member of a connector of this type, for example, there is known a conventional circuit configuration disclosed in Patent Reference. The conventional circuit configuration of Patent Reference 1 is the most common and simple configuration, and has a plurality of transmission paths only on one surface of the circuit board and a grounding plate all over the other surface thereof by plating, without having transmission paths in an inner layer of the circuit board.

Patent Reference: U.S. Patent Application Publication No. 2012-0295453A1

In the conventional circuit configuration disclosed in Patent Reference, a plurality of transmission paths corresponds and is electrically connected to a plurality of pad-like connecting sections arranged along an edge of the circuit board. Each transmission path has a smaller width (a dimension in a direction of the arrangement) than that of the corresponding connecting section. The plurality of transmission paths is arranged so as to repeat the arrangement such as that of one grounding transmission path, two adjacent signal transmission paths, and one grounding transmission path. One grounding transmission path is provided each of both sides of two signal transmission paths that compose a pair of transmission paths.

In the conventional circuit configuration disclosed in Patent Reference, the grounding transmission paths are electrically connected to the grounding plate on the other surface with via holes penetrating through the board. In the pair of transmission paths, the transmission paths are close to each other in the width direction, and the both are connected to corresponding connecting sections of paired connecting sections, and form a pair of transmission paths suitable for transmitting high-speed signals. The pair of connecting sections that is electrically connected to the pair of transmission paths increases the distance in the width direction between the both connecting sections of the pair of connecting sections so as to have large width as described above in order to adjust impedance, corresponding to a thickness of the board defined by itself.

In the conventional circuit configuration disclosed in Patent Reference, however, when the connecting sections have large areas with large width, the distance between the both connecting sections in the width direction is increased. Therefore, although it is possible to adjust and improve the impedance, there are issues as follows.

First, since the connecting sections have a large area, when all of the connecting sections are formed on a circuit board surface by plating, a total plating area has to be increased, which results in higher cost.

Second, the respective connecting sections have a large areas, so that it is possible to fully cover points of contacts with mating terminals. Therefore, even if there is some relative displacement among the contacts in the width direction, since the range of the contacts is large, it is advantageous in view of secure contacts. However, the contact surface pressure has to be small, and thereby there is an issue of lower contact reliability.

In view of the problems described above, an object of the present invention is to provide an electrical connector having a circuit member, which can restrain the plating area as small as possible and achieve high contact reliability under high contact surface pressure, while securing the distance between connecting sections, impedance of which is adjustable.

Further objects and advantages of the present invention will be apparent from the following description of the present invention.

SUMMARY OF THE PRESENT INVENTION

According to a first aspect of the present invention, an electrical connector holds circuit members arranged therein by a holding member. Each circuit member is flat and made of an electrically insulating material and has a plurality of connecting sections that are made of a conductive material, provided only on one surface thereof, and electrically connected corresponding to the respective transmission paths. The connecting sections are arranged along edges of each circuit member so as to be capable of contacting with contact terminals of mating connecting member. The width of each connecting section is set larger than the width of each transmission path. Here, the circuit member includes a typical circuit board to be attached alone in an electrical device as well as a blade molded in a specified shape to be mounted and held in a connector, and may include any circuit members, e.g., a flat circuit board having transmission paths formed thereon and pad-like connecting sections, which are electrically connected to the transmission paths and formed and arranged at edges of the circuit member. The connecting sections are formed by directly plating on the circuit board or by providing a sheet metal layer as terminal sections and then plating the sheet metal layer on the circuit board. In either method, formation of the connecting sections includes plating.

According to the first aspect of the present invention, in the electrical connector, the connecting sections are formed having conductive thin sections made of a conductive material at least at both outer edges of the connecting sections in a width direction. Between the conductive thin sections at the both outer edges, insulating areas where there is no conductive material are provided at the same surface level or recessed from the surface level of the conductive thin sections.

According to the first aspect of the present invention, while the connecting sections keep a suitable distance between centerlines thereof according to a thickness of the circuit member such as a circuit board for adjustment of impedance, the insulating areas are provided, and conductive members are provided on both sides of the insulating areas. Therefore, it is possible to significantly reduce the area of the connecting sections at the conductive thin sections. In addition, it is possible to reduce the total plating area as the connecting sections, so that it is possible to reduce the cost for plating. Moreover, increasing the contact surface pressure to contact terminals, which are corresponding parts to the conductive thin sections, it is possible to improve the contact reliability. Furthermore, it is possible to increase allowable displacement in the width direction due to increase in the number of contact points. According to the first aspect of the present invention, it is effective when the transmission paths are paired transmission paths for high-speed signal transmission, but even when the transmission paths are not paired transmission paths but general transmission paths, it is still similarly effective in view of reduction of plating cost.

According to a second aspect of the present invention, the conductive thin sections of the connecting sections formed on each circuit member can be also provided in the middle between the outer edges. In other words, it is also possible to add another conductive thin section. As such, it is possible to increase the allowable displacement in the width direction.

According to a third aspect of the present invention, each connecting sections formed on each circuit member is preferably formed in a frame-like shape with conducting thin sections and a joining thin section. With this configuration, any conductive thin sections form closed path (closed loop) connecting to the transmission path without end, so that it is possible to enhance the strength without an issue of peeling ends from a surface of the circuit board member.

According to a fourth aspect of the present invention, each circuit member has a plurality of transmission paths that form pairs of transmission paths on one surface thereof and have on the other surface thereof a grounding plate that is formed by plating and covers range where the transmission paths are arranged. The grounding plate has ground connecting sections that can contact with ground contact terminals of mating connecting member in the range of the other surface corresponding to the range where connecting sections of the transmission paths are arranged. In the ground connecting sections, parts corresponding to the insulating areas between the conductive thin sections on the one surface are insulating areas where there is no conductive material. With this configuration, it is possible to form insulating areas at corresponding plurality of areas on both surfaces of the circuit board and it is possible to reduce the plating area as a whole.

As described above, according to the present invention, while the distance between centerlines of the connecting sections at edges of circuit members electrically connected to transmission paths is kept at suitable value based on a thickness of a circuit member suitable for high-speed signal transmission, the connecting sections are formed by conductive thin sections on the both outer side edges, and there are provided insulating areas therebetween. With this configuration, it is possible to reduce the total plating area for connecting sections by reducing the areas of connecting sections, and increase the contact surface pressure to mating contact terminals at conductive thin sections that have small areas. As a result, there is an effect of improved contact reliability. Furthermore, as one connecting section, at both outer side edges, i.e., at least two conductive thin sections are present in the width direction, so that the width to displacement of points to contact with mating contact terminals is enlarged.

DETAILED DESCRIPTION OF THE PREFERRED EMBODIMENTS

Hereunder, an embodiment of the present invention will be described with reference to the accompanying drawings.

Figure 1:
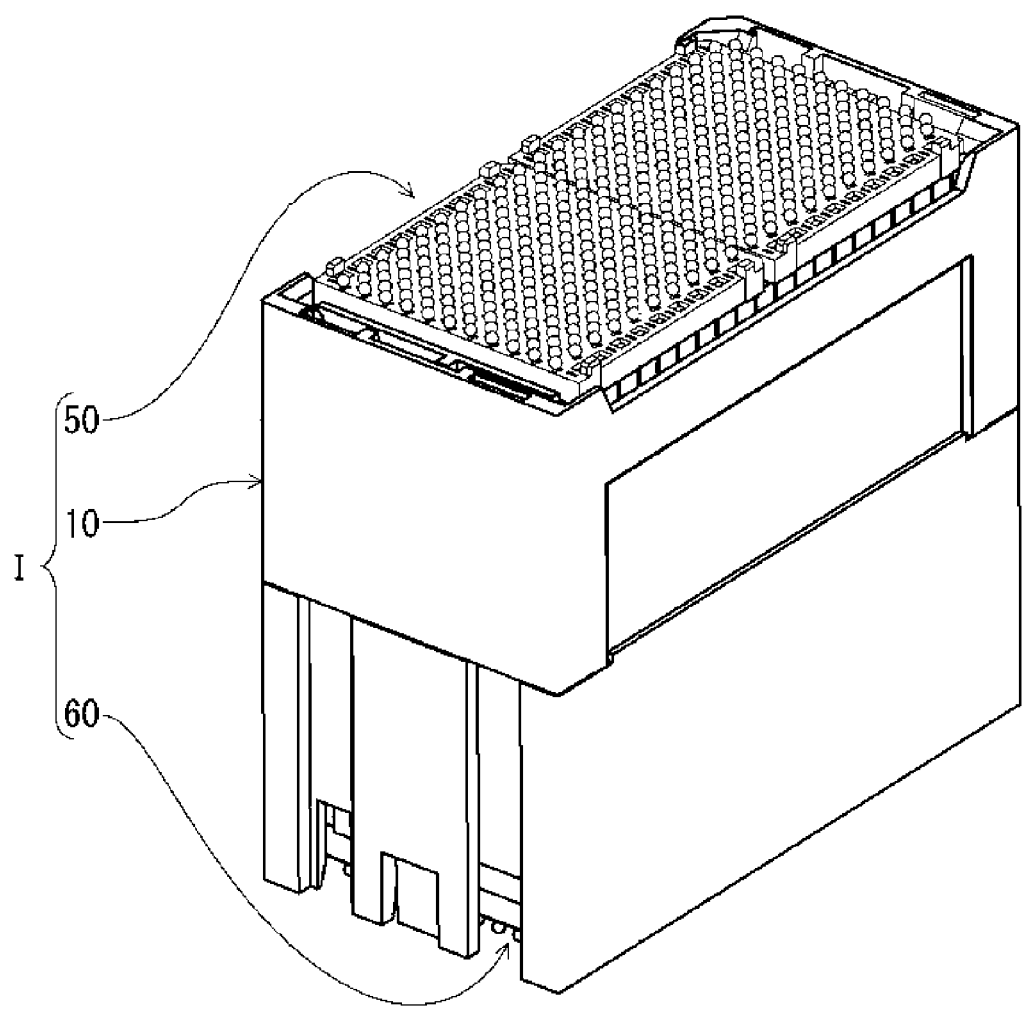
FIG. 1 is a perspective view showing a connector assembled component, in which an electrical connector, an upper mating connector thereof, and a lower mating connector thereof are fitted to assemble according to an embodiment of the present invention.

FIG. 1 is a perspective view showing a state after assembling of a connector assembled component I composed of a connector 10 according to the embodiment, which hold circuit members having transmission paths formed thereon, and mating connectors 50 and 60 that are mating connecting members connected to the connector 10 from thereabove and thereunder, respectively. Both of the mating connectors 50 and 60 hold bottom plates 52 and 62, on which terminals are mounted. Connecting the mating connectors 50 and 60 to the connector 10 from thereabove and thereunder, the two bottom plates 52 are connected via the connector 10. On the other hand, upon use, one mating connector 60 is attached onto a circuit board (not illustrated) provided under the connector 10, and the other mating connector 50 is attached to a circuit board (not illustrated) provided above the connector 10. The forms of the mating connectors are identical to each other.

In the embodiment of the present invention, the circuit members held in the connector 10 include general types of circuit boards to be attached alone to electronic devices, as well as blades or the like that are molded in certain shapes and mounted in connectors, i.e., any circuit members, in which pad-type connecting sections connected to transmission paths are arranged and formed at edges of the circuit members for electrical connection to other members.

As described above, since the mating connectors 50 and 60 are identical to each other, only the mating connector 50 provided above the connector 10 will be described in FIGS. 1 and 2. Explanation of the other mating connector 60 provided under the connector 10 will be omitted, and reference numeral in 60's, which are the number 10 is added to respective reference numerals for corresponding parts of the mating connector 50, will be used for common parts with those of the mating connector 50 when explanation is necessary.

Figure 2:
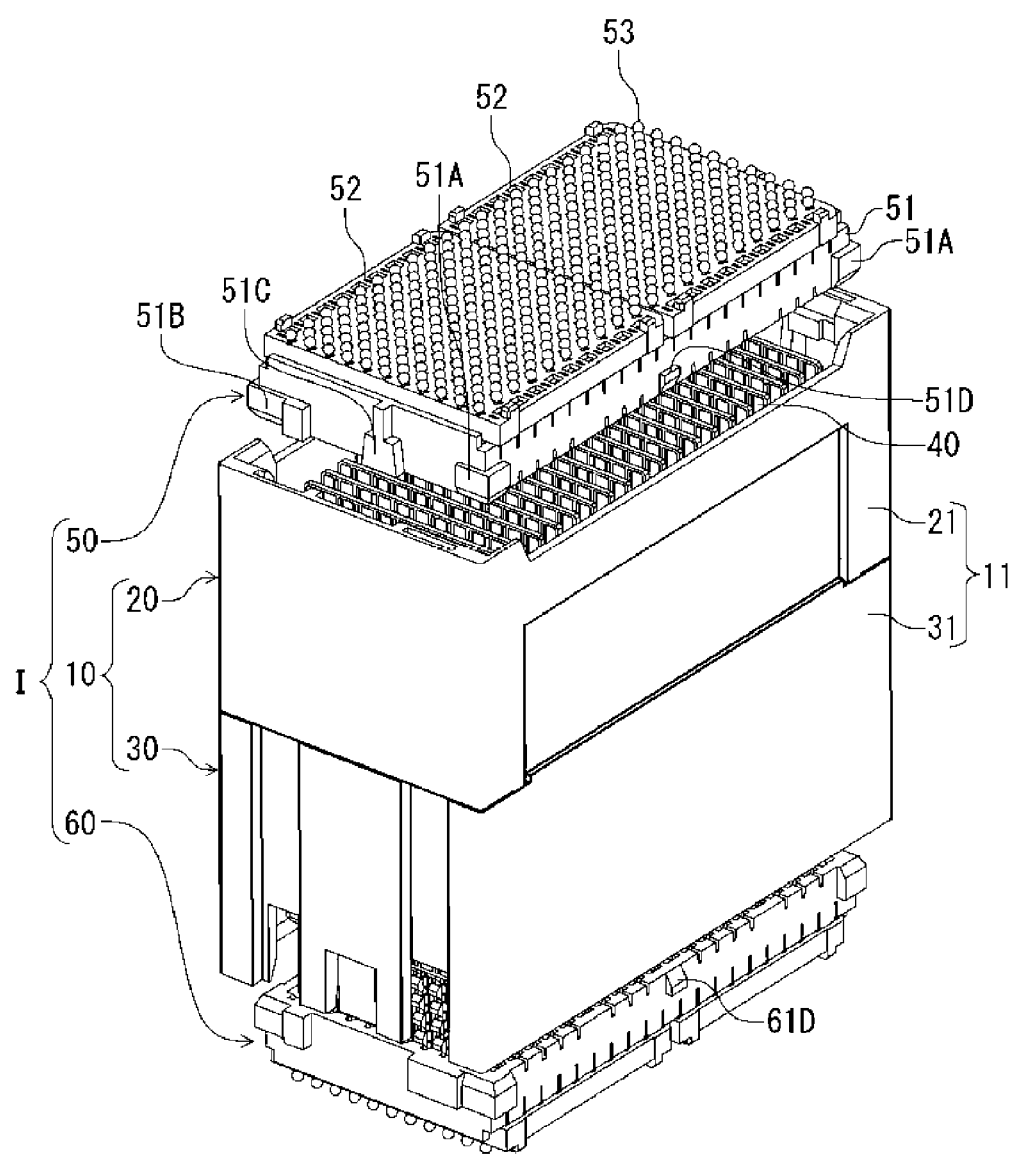
FIG. 2 is a perspective view showing the connector assembled component before fitting the electrical connector to the upper and lower mating connectors according to the embodiment of the present invention.

As shown in FIG. 2, the mating connector 50 has two bottom plates 52 and 52 attached on an outer surface of the bottom plate side (an upper side of the bottom plate 52 in FIG. 1) of the quadrilateral frame-like shaped connector main body 51 made of insulating material. On those bottom plates 52, contact terminals penetrating through the bottom plates 52 in a plate's thickness direction are arranged in columns and rows. On a bottom surface side of the bottom plates 52, solder balls 53 are applied on the contact terminals and the contact terminals protrude downward from the bottom plates 52 in the connector main body 51.

In the embodiment, the contact terminals have at their ends (lower ends) contact sections (not illustrated) that elastically contact with surfaces of the circuit boards of the connector 10, which will be described later. The contact terminals of the mating connector 50 are arranged being a mix of signal terminals and grounding terminals. The contact sections of the signal terminals elastically contact with the connecting sections for transmission paths formed on one surface of each circuit board of the connector 10, and the contact sections of the grounding terminals elastically contact with grounding connecting sections formed on the other surface thereof, respectively.

In the embodiment, the signal terminals and the grounding terminals are arranged being staggered at half pitch intervals in the arrangement direction, and the signal terminals and the grounding terminals contact at the staggered positions on the one surface and the other surface of each circuit board of the connector 10.

An outer circumferential surface of the connector main body 51 of the mating connector 50 forms a surface to be guided upon fitting to the connector 10, and has protrusions to be guided 51A and 51B at the four corners thereof. At a left end surface in the figure, there is provided a key protrusion 51C, which has a shape that looks like a key, so as to prevent a fitting error in a left-and-right direction. Here, in order to securely prevent fitting errors, the protrusions to be guided 51A and 51B also have different shapes. Moreover, on an outer side surface of the connector main body 51, there is provided a locking protrusion 51D for fitting and locking the mating connector 50 to the connector 10.

The mating connector 50 formed as described above (which is also the same in the mating connector 60) is not main idea of the present invention. The explanation of the mating connector 50 is simply given as a mating connector to connect to the connector 10 of the present invention, which will foe described below, and further explanation will be omitted.

The connector 10 is formed as one connector, joining an upper connector 20 and a lower connector 30. The upper connector 20 includes an upper case 21 made of an insulating material and the lower connector 30 includes a lower case 31 made of an insulating material. Fitting the upper case 21 and the lower case 31 to each other from above and below respectively, a housing 11, which is a quadrilateral tube-like case, is formed. The housing 11 works as a holding member to hold circuit boards (described later).

Both the upper case 21 and the lower case 31 are opened in an up-and-down direction, penetrating perpendicularly. The housing 11 in a state that the both cases 21 and 31 are fitted and joined holds circuit boards that extend in a height direction in the both upper and lower cases 21 and 31. Each circuit board 40 has a dimension of the height of the housing 11 and a plurality of the circuit boards 40 are held in the housing 11 in rows.

The housing 11 having a shape of a quadrilateral tube-like case has a size and shape, such that inner surfaces of the upper and lower openings thereof can receive and fit to the mating connectors 50 and 60. On an inner circumferential surface of the housing 11, there are also provided locking step-like sections (not illustrated) to prevent the housing 11 from coming off from the mating connector 50 by locking to the locking protrusions 51D of the mating connector 50.

In the embodiment, the mating connector 60 provided thereunder also has on an inner circumferential surface thereof locking step-like sections that lock to the locking step-like sections 61D of the mating connector 60. The housing 11 itself is not a main idea of the present invention. As for the housing 11, since brief explanation is enough as long as it can be understood that the housing 11 serves to arrange and hold a plurality of circuit board 40 at positions so as to be capable of connecting to contact terminals of the mating connectors 50 and 60, and further explanation will be omitted.

As shown in FIG. 2, a plurality of the circuit boards 40 arranged and held in the housing 11 is arranged at constant, intervals in a longitudinal direction of the housing 11. Each circuit board 40 extends in the up-and-down direction and has contact sections at its respective upper and lower edges to electrically connect to the mating connectors 50 and 60.

Figure 3:
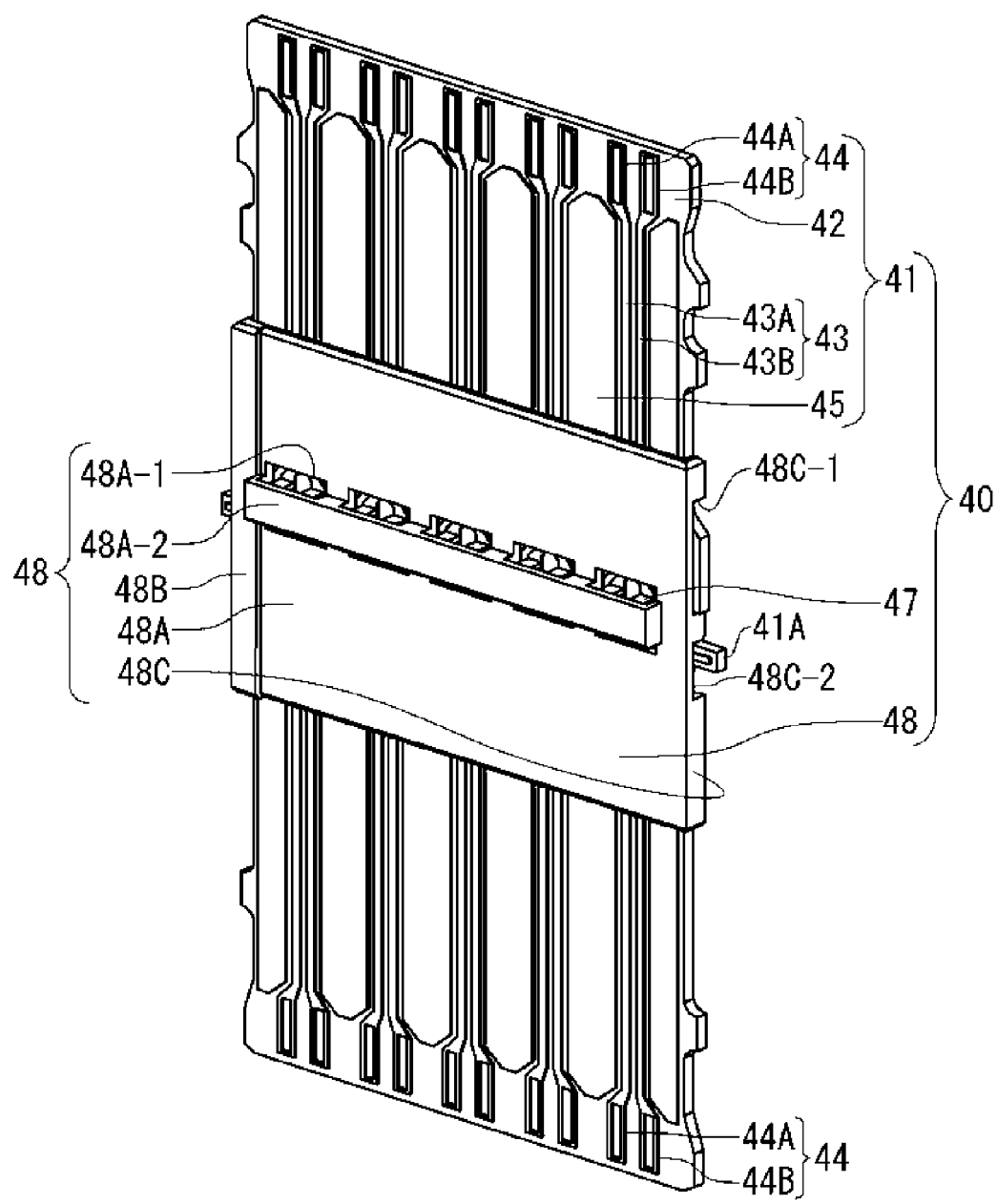
FIG. 3 is a perspective view showing a circuit board used in the electrical connector according to the embodiment of the present invention.

Each circuit board 40 has an outer shape as shown in FIG. 3, and includes a flat board main body 41, electrical elements 47, and a protective cover 48. The board main body 41 includes transmission paths 43 for signal transmission, connecting sections 44, and grounding paths 45, which are provided on one surface of a base material board 42 made of an electrically insulating material, and grounding plates 46 provided on the other surface (described in FIG. 6), which are respectively plated on the base material board 42. The electrical elements 47 are attached to paired transmission paths 43 and will, be described later.

Figure 4:
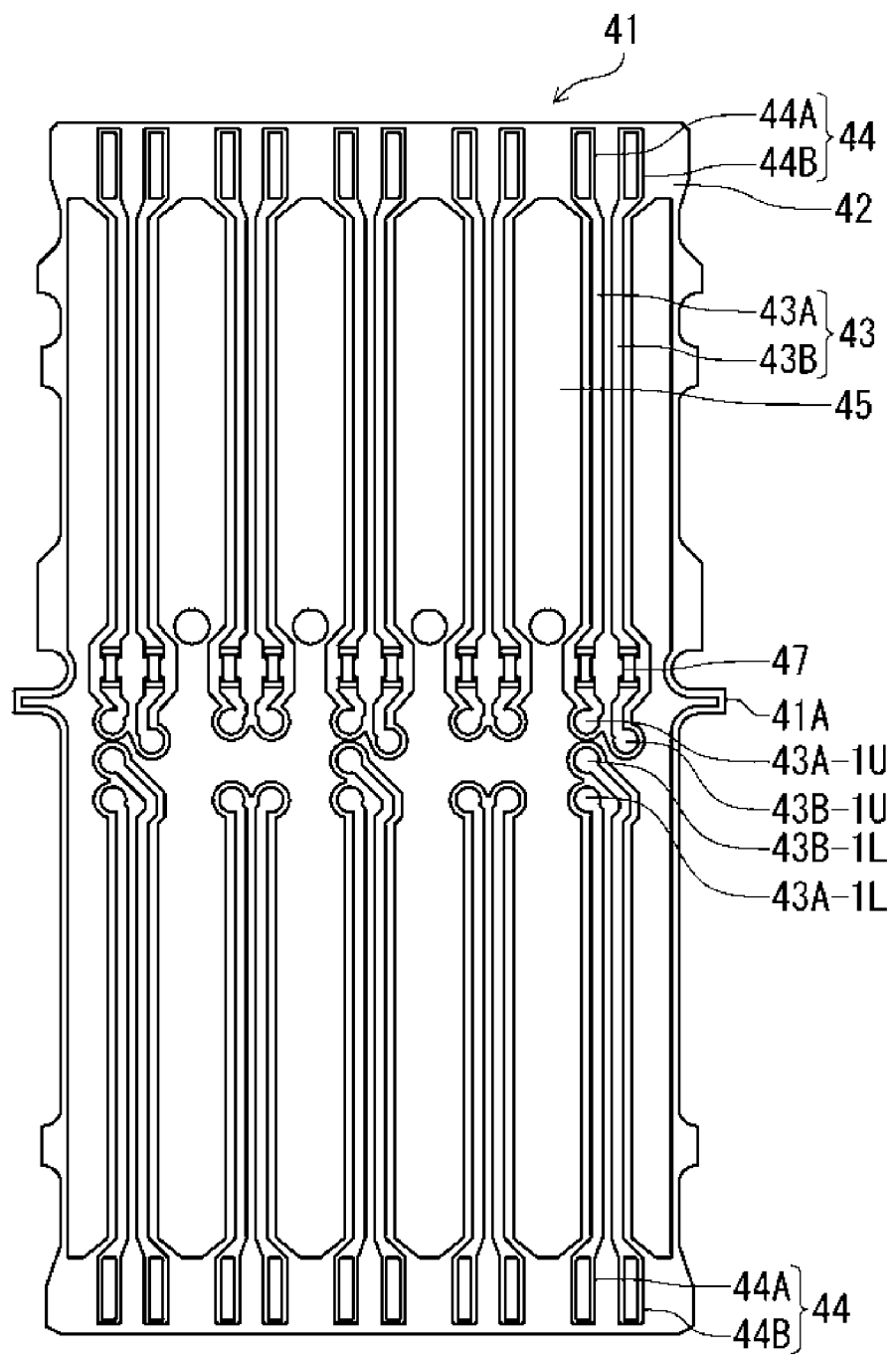
FIG. 4 is a view showing a substrate main body (with electric elements) of the circuit board in a state that a protective cover is removed from the circuit board according to the embodiment of the present invention.
Figure 5:
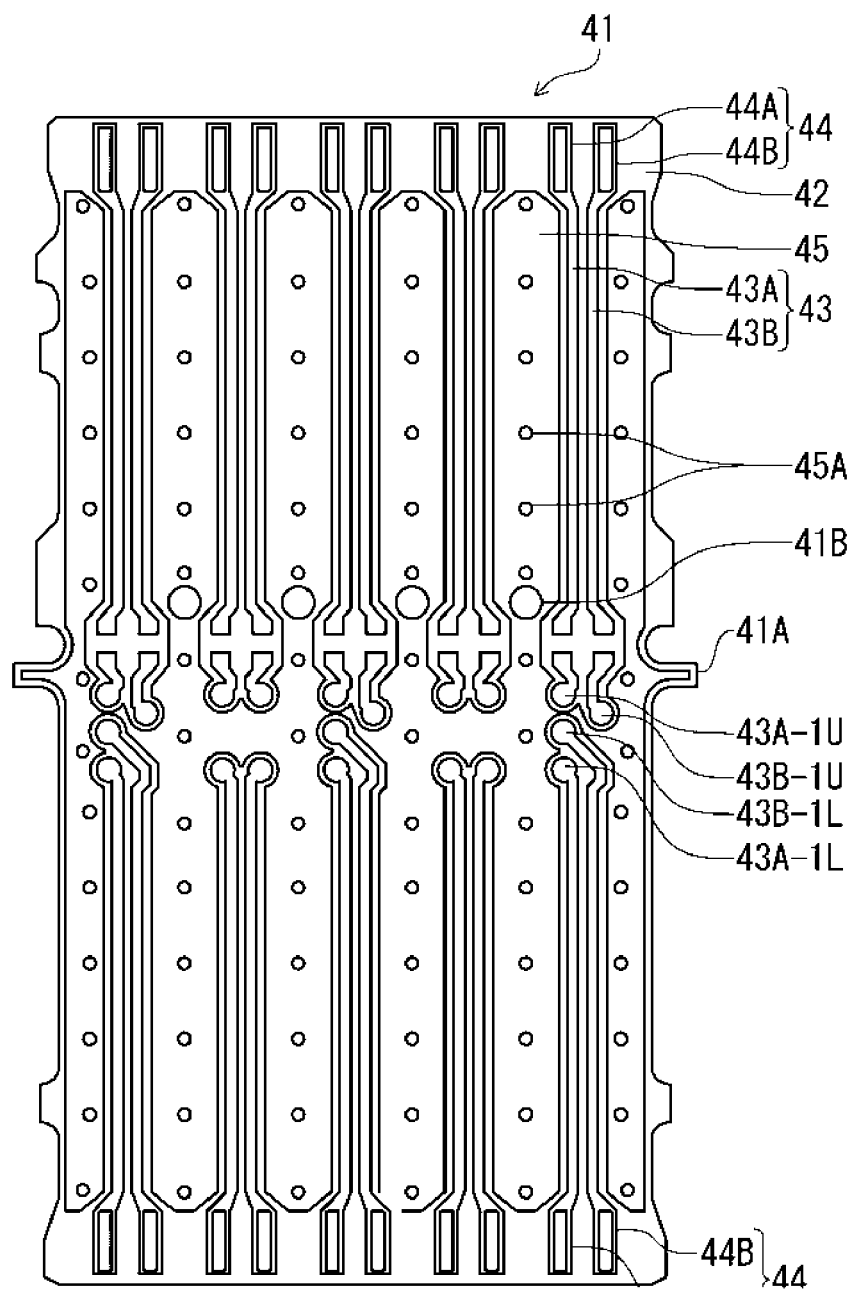
FIG. 5 is a detailed view showing one surface of the substrate main body of the circuit board in a state that the electric elements are removed according to the embodiment of the present invention.

FIG. 4 is a schematic view of the one surface of the board main body 41 showing the paired transmission paths 43 for signals and connecting sections 44, which are provide by plating, and electrical elements 47 connected, to the transmission paths 43 and the grounding paths 45. FIG. 5 is a detailed view of one surface of the board main body 41 before connecting the electrical elements 47 thereto, and FIG. 6 is a view showing the other surface of the board main body 41.

As shown in FIG. 5, each pair of the paired transmission paths 45 for signals are composed of two transmission paths 43A and 43B, forming a pair at adjacent positions and extending in an up-and-down direction. In the example of FIG. 5, there are provided five pairs of the paired transmission paths 43 at intervals in the board's width direction (lateral direction).

Figure 6:
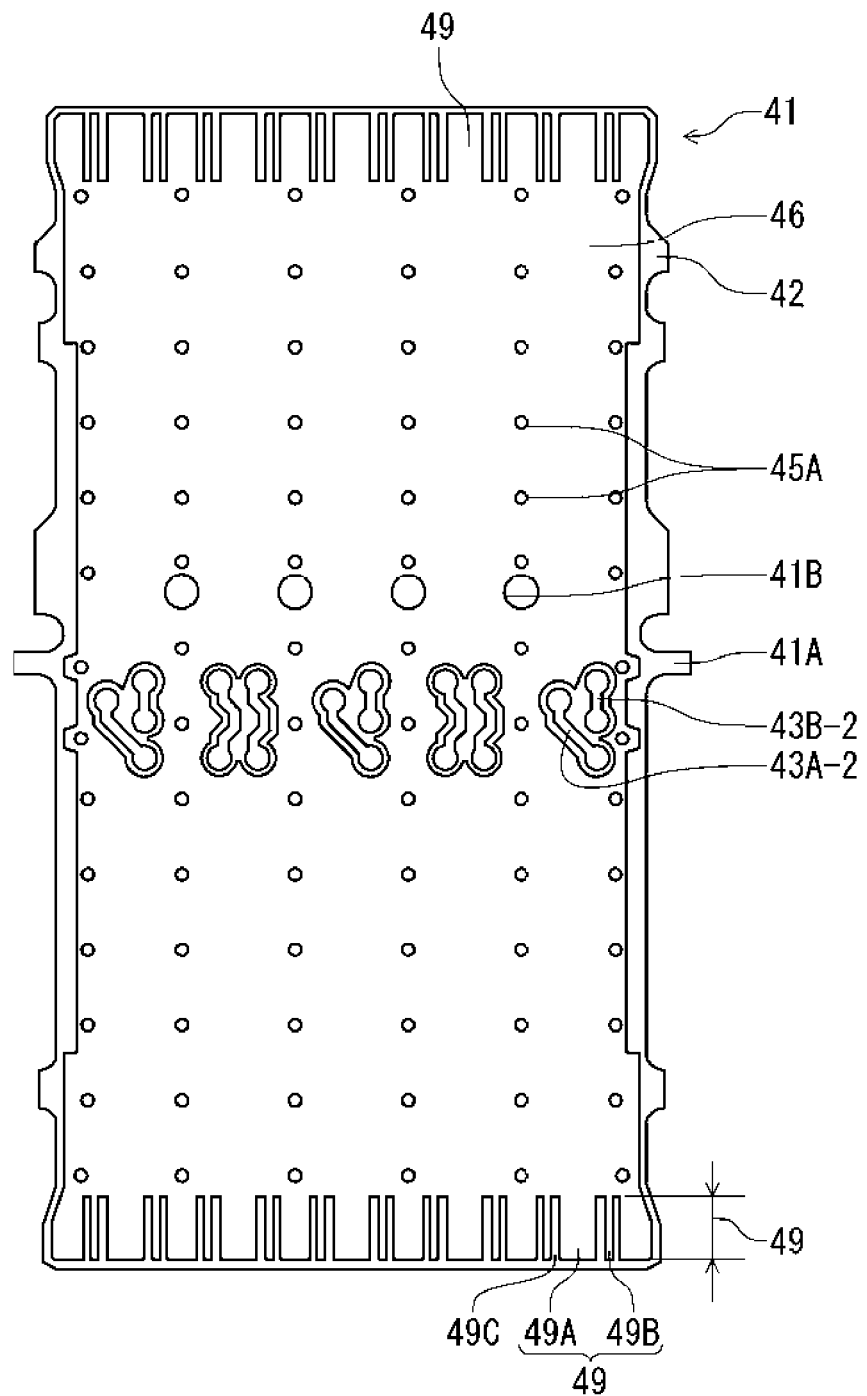
FIG. 6 is a detailed view showing the other surface of the substrate main body of the circuit board according to the embodiment of the present invention.

As shown in FIG. 5, the paired transmission paths 43 are provided being separated into an upper part and a lower part, but as shown in FIG. 6 that shows the other surface of the board main body 41, the both surfaces of the board main body 41 are electrically connected to each other through via holes (which are small holes penetrating the both surfaces of the board main body for electrical connection and not illustrated in the figure), which are formed on pads 43A-2 and 43B-2, respectively. In the up-and-down direction, the paired transmission paths continuously extend to near the upper edge and lower edge of the board main body 41.

Here, since illustration of the electrical elements 47 is omitted in FIG. 5, the transmission paths 43A and 43B on the upper part seem to be discontinuous at the lower end, but are electrically connected by the electrical elements 47 as shown in FIG. 4. In FIG. 5, the above-described five pairs of transmission paths 43 have pads 43A-1U and 43B-1U and pads 43A-1L and 43B-1L, on which the via holes are formed at positions so as to be separated at middle position in the up-and-down direction.

As described above, through the respective via holes, and via the pads 43A-2 and 43B-2 on the other surface, the upper part and the lower part of each transmission path 43 forms one continuous transmission path. Here, in those five pairs of transmission paths 43, there are differences among positions of the pads 43A-1U, 43B-1U; 43A-1L, 43B-1L; 43A-2, 43B-2. These differences are based on that straight pairs and crossed pairs are alternately arranged within the plate's thickness direction of the board main body 41, in order to reduce crosstalk between adjacent differential pairs, on the five differential pair line, so as to form a differential pair line having two transmission lines as a pair for a purpose of high-speed signal transmission and noise reduction.

The two transmission paths 43A and 43B of the paired transmission paths 43 that form a pair are electrically connected to the connecting sections 44 (44A and 44B) provided being plated in a pair on the upper edge and the lower edge of the board main body 41. The transmission paths 43A and 43B are adjacent to each other in the up-and-down direction with very short intervals between the connecting sections 44 and the pads 43A-1U, 43B-1U; 43A-1L, 43B-1L, and have large intervals only at positions communicating with the connecting sections 44 and transitional range for communication with the pads 43A-1U, 43B-1U; 43A-1L, 433-1L. The connecting sections 44 are the main idea of the present invention and will be fully described below.

As shown in FIG. 5, being plated on one surface of the board main body 41, there are grounding paths 45 that are continuous in the up-and-down direction between pairs of the paired transmission paths 43 and on both side edges of the board main body 41. More specifically, the grounding paths 45 are provided on both sides of each pair of the transmission paths 43 so as to have a pair of the transmission paths 43 therebetween. On each grounding path 45, there is provided a plurality of via holes 45A for connecting to grounding plate 46, which is provided on the other surface of the board main body 41 and will be described later. In FIG. 5, within the range of the grounding paths 45, there are formed circular through holes 41B formed near the pads 43A-1U and 43B-1U penetrating the board main body 41 in the plate's thickness direction. Those circular through holes 41B are used for attaching the protective cover 48 shown in FIG. 4 on the board main body 41.

As shown in FIG. 3, the protective cover 48 is provided on the board main body 41 at the middle part thereof in the up-and-down direction. The protective cover 48 is formed like a lid that covers where the pads 43A-1U, 43B-1U; 43A-1L are present. The protective cover 48 is made of an insulating material, and as shown in FIG. 3, has a flat section 48A that faces the one surface of the board main body 41 and side plate sections 48B and 48C on the both sides, and is formed as a thin lid.

On the flat plate section 48A of the protective cover 48, there are formed widow sections 48A-1 so as not to contact to press the electric elements 47 attached on the transmission paths of the board main body 41. Furthermore, on the flat plate section 48A, there is integrally formed a protective strip section 48A-2 that is lifted so as to be away from the surface of the board main body 41 and extends in a lateral direction so as to protect the window sections 48A-1. On the side plate section 48B and the side plate section 48C, there are formed notches 48C-1 and 48C-2 for protrusions 41A to protrude, which are provided on the side edges of the board main body 41 and will be described later. The side plate section 48B provided on the left side has a step-like thin section so as to have a larger thickness than the side plate section 48C provided on the right side.

When each circuit board 40 is inserted to be disposed in a specified insertion groove formed on inner walls of the housing 11, the protective cover 48 is guided to be inserted in the insertion groove. At this point, since the thicknesses are different, it is possible to have the left edge and the right edge inserted in correct orientation. After inserting the above-described short circular cylinder-like bosses, which protrude from the flat plate section 43A, in the above-described through holes 41B, the bosses are softened by ultrasonic welding or by other method so as to close the through holes 41B. The, as the bosses become hardened as temperature is lowered, the protective cover 48 is secured on the board main body 41.

As shown in FIGS. 3 to 5, on the board main body 41, there is formed a plurality of protrusions on the both side edges. The plurality of protrusions is provided so as to protrude from the notches 48C-1 and 48C-2 of the protective cover 48 for positioning of the circuit board 40 in the housing 11. The protrusions 41A, which are small and provided at a center in the height direction and protrude more than other protrusions, are protrusions to be tightly held by the upper case 21 and the lower case 31 that form the housing 11 and for positioning and being held.

Figure 7:
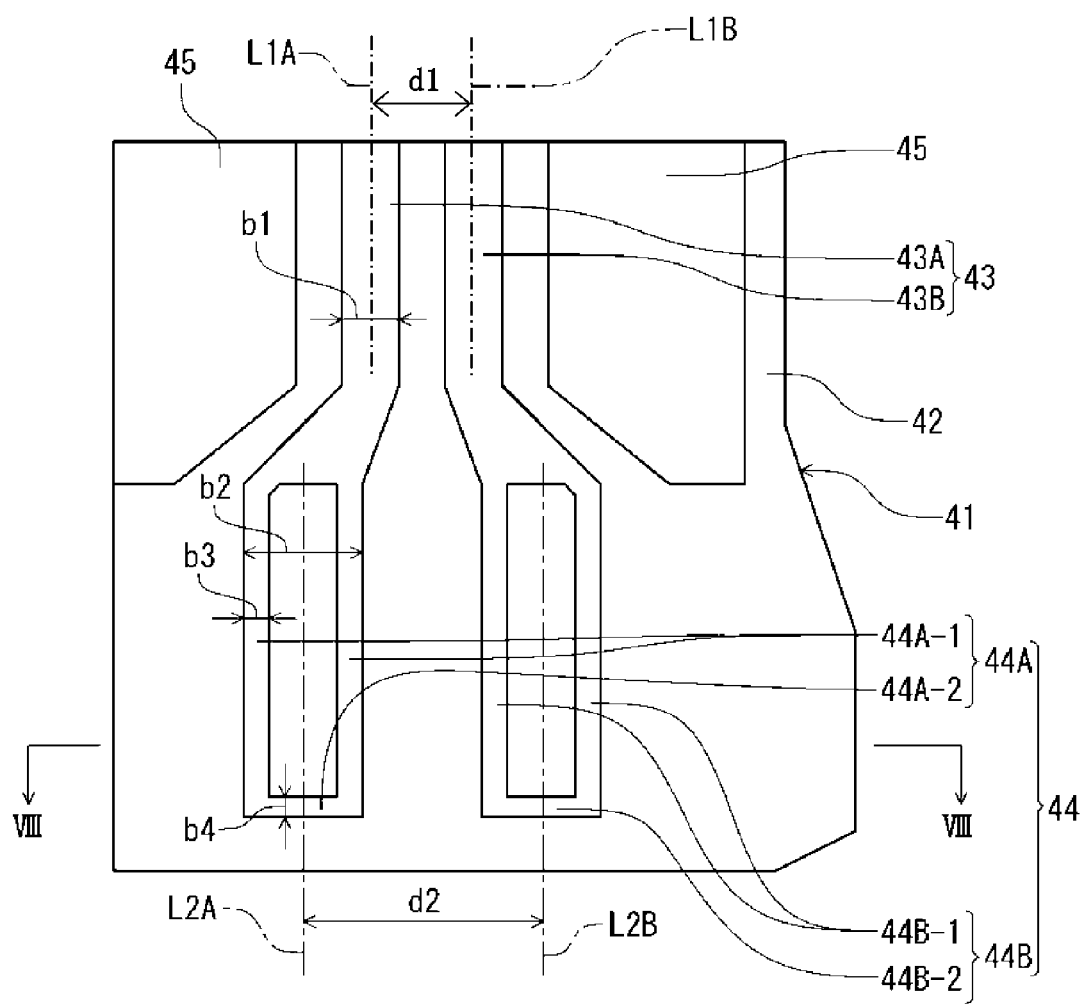
FIG. 7 is an enlarged view showing a part of connecting sections and surrounding area thereof of the circuit board according to the embodiment of the present invention.

Next, the connecting sections 44, that is the main feature of the present invention, will be described. The connecting sections 44 are arranged and formed being plated on the upper edge and the lower edge of each board main body 41, and are connected to upper ends and lower ends of the paired transmission paths 43. FIG. 7 is an enlarged view near two connecting sections 44 (44A and 44B) provided on the right lower edge of the circuit board 40 in FIG. 4, corresponding to one pair of the transmission paths 43 (transmission path 43A and transmission path 43B).

As shown in FIG. 7, the two transmission paths 43A and 43B are respectively arranged side by side being close to each other in the width direction (in a left-and-right direction in the figure). At their lower ends, while slightly increasing the width of the transmission path itself, the distance between the transmission paths 43A and 43B is increased. On the both sides of the pair of transmission paths 43, there are provided the grounding paths 45.

The relation between the distance d1 between centerlines L1A and L1B of the transmission paths 43A and 43B that go through centers in width's directions and the distance d2 between centerlines L2A and L2B of the connecting sections 44A and 44B that correspond to the transmission paths 43A and 43B is d2>d1. The ratio between d2 and d1 in the relation is suitably set according to a thickness of the board main body 41 so as to adjust impedance. As described above, the relation d2>d1 is achieved by increasing the width itself, i.e., the distance therebetween in the transitional area from the transmission paths 43A and 43B to the connecting sections 44A and 44B.

All the connecting sections 44A and 44B are formed to have frame-like shapes. More specifically, any of the connecting sections 44A and 44B has conductive thin sections 44A-1 and 44B-1 made of a conductive material on both side edges in their width directions. The both conductive thin sections 44A-1 and 44B-1 are joined at their lower ends with joining thin sections 44A-2 and 44B-2, respectively, and with the transmission paths 43A; 43B, quadrilateral frame-like shapes are made.

In the embodiment, the distance b2 between the both conductive thin sections 44A-1 (which will be also the same for the distance between both conductive thin sections 44B-1) is larger than the width b1 of the corresponding transmission path 43A. According to the embodiment, however, the width b3 of one conductive thin section 44A-1 is smaller than the width b1 of the transmission path 43A. The strip widths (a dimension in a height direction in FIG. 7) of the joining thin sections 44A-2 and 44B-2 are not limited by the relation with the widths b1, b2, and b3, but are preferably close to b3.

Accordingly, the connecting sections 44A and 44B are formed by the both conductive thin sections 44A-1, conductive thin sections 44B-1, and joining thin sections 44A-2 and 44B-2. According to the present invention, the connecting sections 44A and 44B essentially require presence of the both conductive thin sections 44A-1 and the both conductive thin sections 44B-1, but the joining thin sections 44A-2 and 44B-2 are not essential, and the both conductive thin sections 44A-1 do not have to be joined at their lower ends. However, in order to enhance the holding strength of the both conductive thin sections 44A-1 and 44B-1 by the board main body 1, it is preferred to have the joining sections 44A-2 and 44B-2 present. For the same reason, the both conductive thin sections 44B-1 are preferably joined with the joining section 44B-2.

Figure 8:
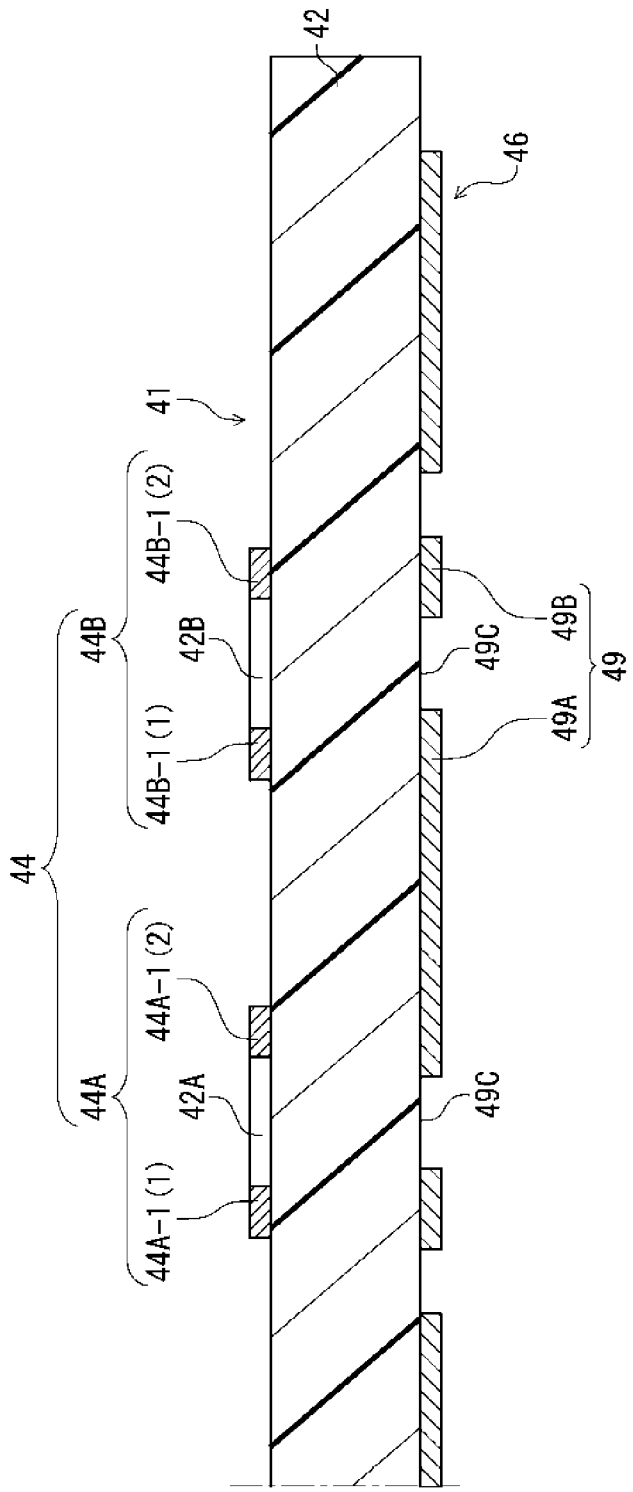
FIG. 8 is a sectional view showing the connecting sections and the surrounding area thereof of the circuit board taken along a line VIII-VIII in FIG. 7 according to the embodiment, of the present invention.

In the connecting sections 44A and 44B formed in frame-like shape, the areas surrounded by the frames are a surface of the base material board 42 itself of the board main body 41, and are insulating areas 42A and 42B. As shown in FIG. 8, which is a sectional view taken along a line VIII-VIII of FIG. 7, the insulating areas 42A and 42B are recessed, relative to the conductive thin sections 44A-1 and 44B-1. Therefore, when the contact terminals of the mating connecting member contact with the connecting sections 44A and 44B with elastic pressure in the thickness direction of the board main body 41, it is possible to securely contact with the conductive thin sections 44A-1 and 44B-1.

In addition, at this point, the contact areas of the conductive thin sections 44A-1 and 44B-1 to the contract terminals of the mating connecting member are smaller due to the presence of the insulating areas 42A and 42B, and the contact pressure is enhanced and the contact reliability is improved. At the same time, it is possible to reduce the total plating area upon forming all the connecting sections, and thereby it is possible to reduce the cost for plating. Here, surface levels of the insulating areas 42A and 42B can be at the same as or close to the surface level of the conductive thin sections 44A-1 and 44B-1, unless the contact between the conductive thin sections 44A-1 and 44B-1 and the contact terminals of the mating connecting material is not inhibited, or unless the contact pressure is not reduced to be less than a suitable value.

According to the embodiment, the connecting sections 44A and 44B have conductive thin sections 44A-1 and 44B-1 only on the both sides, but it is also possible to provide another conductive thin section in the middle, for example, so as to have three conductive thin sections disposed in rows present. Even in this case, it is preferred to join the middle conductive thin sections to the joining thin sections 44A-2 and 44B-2.

As described above, the board main body 41 has paired transmission paths 43, etc. on one surface and has the grounding plate 46 on the other surface as shown in FIG. 6. Similarly to the paired transmission paths 43, etc., the grounding plate 46 is formed being plated on the base material board 42 of the board main body 41, and extend all over the surface of the base material board 42 except, very limited excluded area. The excluded area where grounding plate 46 is not formed includes narrow areas at peripheral edges on the base material board 42 that does not require shielding, areas where the pads 43A-2 and 43B-2 exist, through holes 41B for securing the protective cover 48, and a limited area in the ground connecting sections, which will be described later.

The grounding plate 46 is provided on the other surface of the board main board 41 in the range corresponding to the range that covers in the up-and-down direction and the width direction the area where the plurality of connecting sections 44 is present for the paired transmission paths 43 formed on one surface of the board main body 41 in FIG. 5. In addition, the grounding plate 46 has ground connecting sections 49.

As shown in FIG. 6, each ground connecting section 49 has a generally comb's teeth-like shape, so as to alternately have an area grounding plate 46 is present and an area grounding plate is not present. As shown in the sectional view taken along the line VIII-VIII of FIG. 8, the ground connecting section 49 is provided so as to alternately have a wide part 49A for contacting with ground contacting terminals of the mating connecting member and a narrow part 49B.

As shown in FIG. 8, the wide parts 49A are provided so as to be staggered on the other surface of the board main body 41 relative to the connecting sections 44 (44A and 44B) formed on the one surface of the board main body 41. For example, in FIG. 8, the wide part 49A provided at the center is provided in the range where the conductive thin section 44A-1(2) on the right side in the two conductive thin sections 44A-1(1) and 44A-1(2) of the connecting section 44A and the conductive thin section 44B-1(1) on the left side in the two conductive thin sections 44B-1(1) and 44B-1(2) of the connecting section 44B.

The narrow sections 49B are provided so as to correspond to the conductive thin section 44A-1(1) on the left, side in the conductive thin sections 44A-1(1) and 44A-1(2) of the connecting section 44A and the conductive thin section 44B-1(2) on the right side in the two conductive thin sections 44B-1(1) and 44B-1(2) of the connecting section 44B, respectively, and work as shielding against the conductive thin sections 44A-1 and 44B-1.

Therefore, the narrow parts 49B do not serve for contacting with the ground contact terminals of the mating connecting member. Between the wide parts 49A and the narrow parts 49B, there is no ground connecting sections 49 and form insulating areas 49C, corresponding to the insulating areas 42A and 42B of the connecting sections 44 in the width direction. While providing narrow parts 49B that work for shielding, by providing the insulating areas 49C, it is possible to reduce the plated areas as a whole upon forming the grounding plate 46 by plating.

The disclosure of Japanese Patent Applications No. 2013-163326, filed on Aug. 6, 2013, is incorporated in the application by reference.

While the present invention has been explained with reference to the specific embodiments of the present invention, the explanation is illustrative and the present invention is limited only by the appended claims.

What is claimed is:

1. An electrical connector to be connected to a mating connector, comprising:
   a circuit board member formed of an insulation plate member; and
   a holding member for holding the circuit board member, wherein said circuit board member includes a pair of transmission paths and a pair of connecting sections to be connected with a mating connector of the mating connector, each of said transmission paths has a first width, each of said connecting sections includes a conductive thin section and a first insulation region, said conductive thin section has a second width smaller than the first width, said transmission paths are arranged in parallel so that center lines passing through the transmission paths are away from each other by a first distance, and said connecting sections are arranged in parallel so that center lines passing through the connecting sections are away from each other by a second distance greater than the first distance.

2. The electrical connector according to claim 1, wherein said first insulation region is formed as a recessed portion.

3. The intermediate electrical connector according to claim 1, wherein each of said connecting sections further includes a joining thin section connecting the conductive thin section so that the joining thin section and the conductive thin section are arranged in a frame shape.

4. The intermediate electrical connector according to claim 1, wherein said circuit board member further includes a ground plate disposed on the insulation plate member, said ground plate includes a ground connecting portion to be contacted with a mating ground contact terminal of the mating connector, and said ground connecting portion includes a second insulation region disposed at a location on an opposite side of the insulation plate member to that of the first insulation region.

5. The intermediate electrical connector according to claim 1, wherein said transmission paths are arranged in parallel in a first direction, said connecting sections are arranged in parallel in the first direction, and each of said transmission paths is connected to respectively each of the connecting sections through an inclined section extending in a second direction inclined relative to the first direction.

6. The intermediate electrical connector according to claim 3, wherein said connecting sections are arranged so that the frame shapes are arranged next to each other with a third insulation region in between.

\* \* \* \* \*